United States Patent
Dobner et al.

(10) Patent No.: US 9,437,792 B2
(45) Date of Patent: Sep. 6, 2016

(54) OPTOELECTRONIC SEMICONDUCTOR COMPONENT

(75) Inventors: Andreas Dobner, Wenzenbach (DE); Joerg Sorg, Regensburg (DE); Ralph Wirth, Lappersdorf (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 14/347,293

(22) PCT Filed: Aug. 30, 2012

(86) PCT No.: PCT/EP2012/066804
§ 371 (c)(1),
(2), (4) Date: Mar. 26, 2014

(87) PCT Pub. No.: WO2013/045196
PCT Pub. Date: Apr. 4, 2013

(65) Prior Publication Data
US 2014/0246688 A1   Sep. 4, 2014

(30) Foreign Application Priority Data

Sep. 29, 2011 (DE) .................. 10 2011 083 691

(51) Int. Cl.
*H01L 33/00* (2010.01)
*H01L 33/62* (2010.01)
*H01L 33/60* (2010.01)
*H01L 25/075* (2006.01)

(52) U.S. Cl.
CPC ............... *H01L 33/62* (2013.01); *H01L 33/60* (2013.01); *H01L 25/0753* (2013.01); *H01L 2224/48137* (2013.01); *H01L 2924/3025* (2013.01)

(58) Field of Classification Search
None
See application file for complete search history.

(56) References Cited

U.S. PATENT DOCUMENTS

| 2003/0107316 A1 | 6/2003 | Murakami et al. |
| 2003/0142500 A1 | 7/2003 | Bachl et al. |
| 2006/0108669 A1 | 5/2006 | Matsumoto et al. |
| 2009/0147498 A1 | 6/2009 | Park |

(Continued)

FOREIGN PATENT DOCUMENTS

| CN | 1685578 A | 10/2005 |
| CN | 101080822 A | 11/2007 |

(Continued)

OTHER PUBLICATIONS

Korean Office Action based on application No. 10-2014-7011632 (5 pages) dated Apr. 28, 2015 (for reference purpose only).

(Continued)

*Primary Examiner* — Daniel Whalen
(74) *Attorney, Agent, or Firm* — Viering, Juntschura & Partner mbB

(57) ABSTRACT

An optoelectronic semiconductor component includes: at least one optoelectronic semiconductor chip, a leadframe having one a plurality of leadframe parts, at least two electrical connection means via which the semiconductor chip is electrically contact-connected to the leadframe, and a potting body, which is fitted to the leadframe and mechanically supports the latter, wherein the one or at least one of the leadframe parts is provided with a reflective coating at a top side, the semiconductor chip is fitted on the reflective coating at the top side, the leadframe includes at least two contact locations, onto which the connection means are directly fitted, and the contact locations are formed from a material that is different from the reflective coating.

14 Claims, 6 Drawing Sheets

(56) References Cited

U.S. PATENT DOCUMENTS

| | | | |
|---|---|---|---|
| 2010/0078669 A1* | 4/2010 | Cho | H01L 33/46 257/98 |
| 2010/0207152 A1* | 8/2010 | Won | H01L 25/167 257/98 |
| 2011/0012497 A1 | 1/2011 | Sumiya et al. | |
| 2011/0057217 A1 | 3/2011 | Peng et al. | |
| 2012/0127720 A1* | 5/2012 | Hussell | H01L 25/0753 362/249.02 |

FOREIGN PATENT DOCUMENTS

| | | |
|---|---|---|
| JP | S61148883 A | 7/1986 |
| JP | 2004146815 A | 5/2004 |
| JP | 2006173561 A | 6/2006 |
| JP | 2007067116 A | 3/2007 |
| KR | 1020110101940 A | 9/2011 |
| WO | 2004064154 A1 | 7/2004 |
| WO | 2006065007 A1 | 6/2006 |

OTHER PUBLICATIONS

International Search Report for PCT/EP2012/066804 dated Jan. 9, 2013, 12 pages.
German Office Action for 10 2011 083 691.8 dated Aug. 24, 2012, 6 pages.
Chinese Office Action based on Application No. 201280047960.2(7 Pages and 9 Pages of English translation) dated Dec. 28, 2015 (Reference Purpose Only).

\* cited by examiner

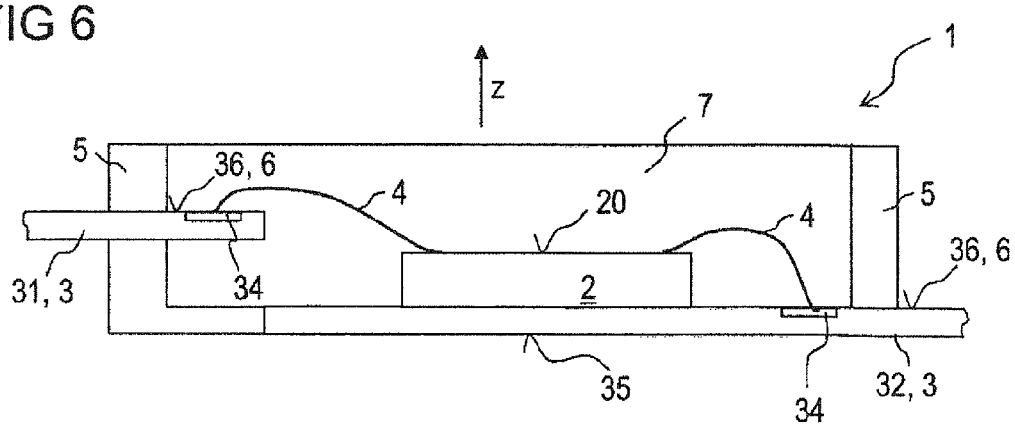
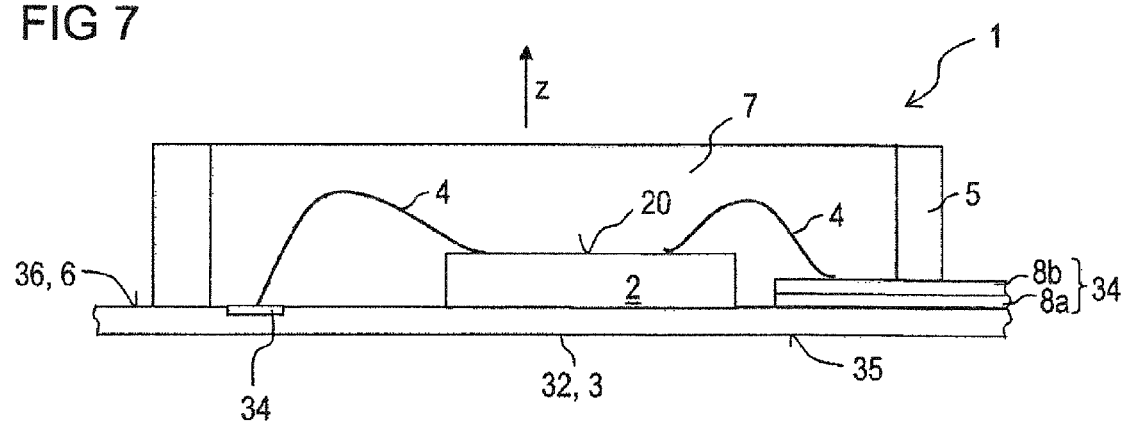
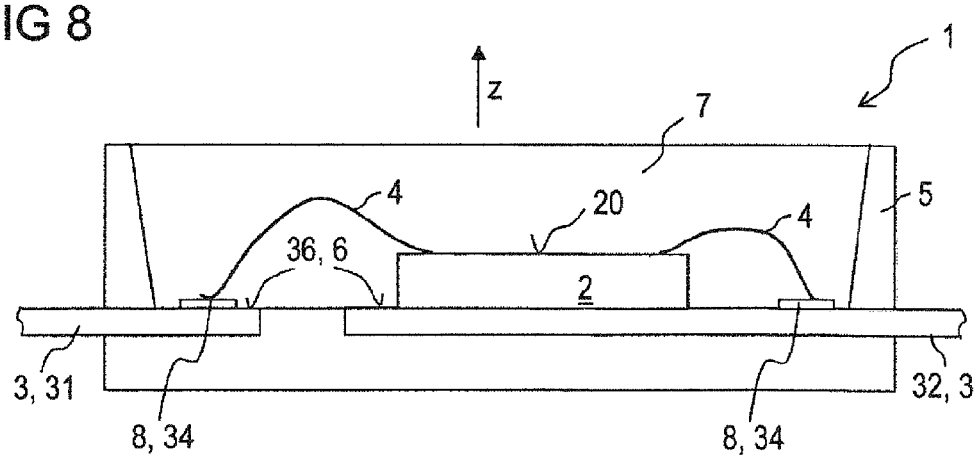

OPTOELECTRONIC SEMICONDUCTOR COMPONENT

RELATED APPLICATIONS

The present application is a national stage entry according to 35 U.S.C. §371 of PCT application No.: PCT/EP2012/066804 filed on Aug. 30, 2012, which claims priority from German application No.: 102011083691.X filed on Sep. 29, 2011, and is incorporated herein by reference in its entirety.

TECHNICAL FIELD

An optoelectronic semiconductor component is specified.

SUMMARY

Various embodiments provide an optoelectronic semiconductor component which has a high light coupling-out efficiency and which can be produced efficiently.

In accordance with at least one embodiment of the optoelectronic semiconductor component, the latter includes one, preferably a plurality of optoelectronic semiconductor chips. The at least one semiconductor chip is, for example, a photodiode or, preferably a light-emitting diode. The semiconductor chip can likewise be shaped as a semiconductor laser. In addition to the semiconductor chip, the semiconductor component optionally also includes a protective diode against electrostatic discharge, ESD protective diode for short.

In cases where the term semiconductor chip is used in the singular hereafter, this also includes a plurality of semiconductor chips. The stated properties or features with regard to the semiconductor chip or semiconductor chips then preferably apply to a majority of the semiconductor chips or to all the optoelectronic semiconductor chips, in particular to all such semiconductor chips which are designed for emitting radiation during the intended operation of the semiconductor component.

In accordance with at least one embodiment, the semiconductor component includes a leadframe. The leadframe has one leadframe part or a plurality of leadframe parts. The leadframe parts are preferably shaped from a metallic material, preferably on the basis of metals such as copper or aluminum, for example a copper alloy or an aluminum alloy, and are not directly electrically connected to one another within the semiconductor component. The semiconductor component may be externally electrically contact-connected via the leadframe.

In accordance with at least one embodiment the semiconductor component includes at least two electrical connection means. Via the connection means, the semiconductor chip is directly or indirectly electrically contact-connected to the leadframe and to one or a plurality of the leadframe parts. The connection means is preferably a bonding wire, a flexible conductor tape or an electrically conductive coating which extends from an electrical contact area of the semiconductor chip toward at least one of the leadframe parts.

In accordance with at least one embodiment the semiconductor component includes at least one potting body. The potting body is fitted to the leadframe and mechanically supports the latter. If the leadframe has a plurality of leadframe parts, then the potting body mechanically connects the leadframe parts to one another. It is possible for the potting body to be embodied as a reflector or reflector part for radiation emitted by the semiconductor chips and to include additional coatings for this purpose.

In accordance with at least one embodiment of the semiconductor component, one or a plurality of the leadframe parts is or are provided with a reflective coating at a top side. A reflectivity of the coating for radiation in the visible spectral range, for example at a wavelength of 480 nm, is at least 90%, preferably at least 95%, particularly preferably at least 97.5%. Coating means that, with respect to a base material of the leadframe or of the corresponding leadframe part, one further or a plurality of further materials which, in particular, are different from the base material are applied to said base material.

In accordance with at least one embodiment of the semiconductor component, the semiconductor chip is fitted on the reflective coating at the top side. In other words, the reflective coating is situated directly below the semiconductor chip, as seen in a plan view of the top side. An underside of the leadframe or of the leadframe part, wherein the underside is situated opposite the top side and, in particular, no semiconductor chip is fitted to the underside, is preferably free of the reflective coating. The semiconductor chip is preferably fitted on the top side, for example by means of an optically transparent and pellucid adhesive, in such a way that a reflective effect of the coating below the semiconductor chip for radiation generated by the semiconductor chip is not or not significantly impaired by the adhesive, for instance. In other words, radiation generated in the semiconductor chip can be reflected at the reflective coating, without significant absorption losses or scattering losses occurring.

In accordance with at least one embodiment of the semiconductor component, the leadframe includes at least two contact locations. The connection means is fitted directly onto the contact locations. In particular, the contact locations are designed for fixing a bonding wire around. For this purpose, the contact locations preferably include a comparatively soft material such as gold, silver or aluminum. Likewise, the contact locations may include or consist of materials such as palladium or NiP, in particular having a phosphorus proportion of up to 10%. It is possible for the leadframe parts each to include at most one of the contact locations.

In accordance with at least one embodiment of the semiconductor component, the contact locations are formed from a material that is different from a material of the reflective coating. In other words, the contact locations are not formed by a partial region of the reflective coating.

In at least one embodiment of the optoelectronic semiconductor component, the latter includes at least one optoelectronic semiconductor chip and a leadframe having one or a plurality of leadframe parts. Furthermore, the semiconductor component includes at least two electrical connection means, such as bonding wires, via which the semiconductor chip is electrically contact-connected to the leadframe. A potting body is fitted to the leadframe and mechanically supports the latter. In this case, one or a plurality of the leadframe parts is or are provided with a reflective coating at a top side, on which the semiconductor chip is fitted. In this case, the semiconductor chip is fitted on the reflective coating. The leadframe additionally includes at least two contact locations, onto which the connecting means are fitted. The contact locations are shaped from a material that is different from the reflective coating.

The reflective coating makes it possible to realize a high light coupling-out efficiency of the semiconductor component, in particular if the semiconductor chip includes a radiation-transmissive substrate, such as a sapphire substrate, through which radiation generated in a semiconductor layer sequence of the semiconductor chip passes to the leadframe. The fact that the contact locations are free of the reflective coating enables electrical contact to be made with the semiconductor chip efficiently by means of bonding wires, in particular.

In accordance with at least one embodiment the semiconductor component includes a leadframe having at least two, preferably having at least three, leadframe parts. The leadframe parts are produced from the same stamping carrier. In this case, a stamping carrier is, for example, a semifinished product which is in the form of a metal sheet and from which the leadframe parts are stamped. The stamping carrier is, for example, an aluminum sheet provided with the reflective coating at one side.

In accordance with at least one embodiment the reflective coating is applied continuously at all the top sides of the leadframe parts. Undersides of the leadframe parts, said undersides being situated opposite the top sides, are free of the reflective coating. That is to say, then, at no regions in which the reflective coating is removed are formed at the top sides. Furthermore, no further coating layers are applied on the reflective coating, except for the direct fixing of the semiconductor chip or a contact pedestal. Specifically, no conductor tracks are applied on the reflective coating.

In accordance with at least one embodiment of the semiconductor component, at least one of the leadframe parts, preferably at least two or exactly two of the leadframe parts have a bend. A bending angle is preferably 90° or 180°, preferably with a tolerance of at most 10° or at most 5°. Bend can mean that the bent leadframe part has at least two regions of the top side, wherein normals to these top side regions face in different directions, wherein an angle between the normals preferably has the values mentioned.

In accordance with at least one embodiment of the semiconductor component, at least one of the leadframe parts or at least two of the leadframe parts is or are bent in such a way that a portion of the undersides of the bent leadframe parts or leadframe part faces in the same direction as the top side of a further leadframe part, on which the semiconductor chip is fitted. In other words, as seen in a plan view of the semiconductor component and on the semiconductor chip, a portion of the non-coated underside of the bent leadframe parts then lies at the top. These upwardly facing regions of the underside of the bent leadframe parts preferably form the contact locations for the connection means.

In accordance with at least one embodiment of the semiconductor component, wherein the latter includes an at least or exactly two-part leadframe, at least two of the leadframe parts are produced from mutually different stamping carriers. Said leadframe parts include, for example, mutually different base materials such as copper or aluminum and/or are provided with mutually different coatings, or only one of the leadframe parts is provided with the reflective coating.

In accordance with at least one embodiment, only the top side of the leadframe part on which the semiconductor chip is fitted is provided with the reflective coating. The further top sides of the other leadframe parts and all undersides are then preferably free of the reflective coating.

In accordance with at least one embodiment of the semiconductor component, the reflective coating is removed from the top side of at least one, in particular exactly one, of the leadframe parts at least one of the contact locations. This makes it possible to connect the connection means directly to the base material of the corresponding leadframe part, without obstructing the reflective coating.

In accordance with at least one embodiment of the semiconductor component, the reflective coating forms at least 90% of a top side at which the contact locations are formed, as seen in the plan view. Preferably, the reflective coating covers at least 95% or at least 98% of said top side. The potting body can be disregarded in this case.

In accordance with at least one embodiment of the semiconductor component, at least one of the contact locations, which is preferably situated at one of the top sides, is provided with a contact coating. Fitting the connection means to the corresponding leadframe part can be simplified by means of such a contact coating.

In accordance with at least one embodiment the contact coating is fitted on the reflective coating. In other words, the reflective coating then lies between the leadframe part and the contact coating forming the contact location. The contact coating can also be a layer stack composed of a plurality of layers including different materials.

In accordance with at least one embodiment of the semiconductor component, the top side of the leadframe part on which the semiconductor chip is fitted is shaped in a planar fashion, at least in a region not covered by the potting body. This simplifies the fitting of a larger number of semiconductor chips on the top side.

In accordance with at least one embodiment of the semiconductor component, in a direction away from the top side on which the semiconductor chip is fitted, and along a main emission direction of the semiconductor chip, the contact locations are situated higher than the top side on which the semiconductor chip is situated.

In accordance with at least one embodiment of the semiconductor component, at least one, preferably at least two or exactly two contact pedestals are fitted on the top side of the leadframe part on which the semiconductor chip is situated. A pedestal top side of the contact pedestals preferably lies in one plane with a radiation main side of the semiconductor chip, in particular with a tolerance of at most 15% or of at most 5% of a thickness of the semiconductor chip. The contact pedestal is, for example, electrically insulating at a pedestal underside facing the top side of the leadframe part, and electrically conductive at the pedestal top side. Further functions such as ESD protection can optionally be integrated in the contact pedestal.

In accordance with at least one embodiment at least two or exactly two of the connection means are fitted to the pedestal top side facing away from the leadframe part. One of the connection means preferably extends to one of the contact locations on a further leadframe part, a second of the connection means preferably extends to one of the semiconductor chips. Proceeding from the pedestal top side, a plurality of the semiconductor chips can be electrically contact-connected.

In accordance with at least one embodiment of the semiconductor component, the latter has mutually differently shaped connection means and/or connection means including different materials. By way of example, electrical contact-connection between adjacent semiconductor chips is effected by means of thin bonding wires and contact-connection toward the contact locations at the leadframe parts is effected by bonding wires that are thicker in comparison therewith.

In accordance with at least one embodiment of the semiconductor component, the contact locations are shaded from direct radiation emitted by the semiconductor chip. In other words, there is no straight, uninterrupted connecting line from a radiation main side of the semiconductor chip, said radiation main side facing away from the top side, toward the contact locations. The shading is effected, for example, by parts of the leadframe part at which the contact location is formed, and/or by the potting body. By way of example, the contact locations are framed all around by a material of the potting body.

In accordance with at least one embodiment of the semiconductor component, the potting body is formed from a light-opaque material or includes at least one such material. The potting body is shaped, for example, from a reflective or absorbent plastic.

In accordance with at least one embodiment the leadframe parts or one or a plurality of the leadframe parts include aluminum, in particular an aluminum alloy, as base material. The reflective coating is applied on the base material. The reflective coating includes, in particular, a silver layer on which preferably in turn one or a plurality of layers including a silicon oxide and/or a titanium oxide are shaped. The reflective coating preferably includes a layer stack formed of materials having different refractive indices, with the result that a Bragg mirror is formed. In particular, a metallic mirror, preferably including or composed of silver, and a layer stack in particular including a titanium oxide and including a silicon oxide are combined.

In accordance with at least one embodiment of the semiconductor component, the contact locations are formed with a layer sequence composed of nickel, palladium and gold, wherein the nickel layer is preferably thicker than the gold layer and the palladium layer. A thickness of the nickel layer is preferably between 3 µm and 5 µm inclusive. The palladium layer between the gold layer and the nickel layer preferably has a thickness of at least 100 nm. A thickness of the gold layer is preferably at least 50 nm.

In accordance with at least one embodiment of the semiconductor component, a thickness of the leadframe part or of the leadframe parts on which the semiconductor chip is fitted and/or which are preferably based on aluminum, in particular including the reflective coating, is at most 2 mm or at most 1.5 mm. This thickness exceeds 300 µm or 500 µm, for example.

In accordance with at least one embodiment of the semiconductor component, a thickness of the leadframe part or of the leadframe parts which are designed for external electrical contact-connection of the semiconductor component and which are preferably based on copper is at most 300 µm or at most 200 µm. This thickness exceeds 80 µm or 125 µm, for example.

In accordance with at least one embodiment an average diameter of the leadframe part on which the semiconductor chip is fitted is between 8 mm and 30 mm inclusive, preferably between 15 mm and 28 mm inclusive. Such comparatively large diameters in the case of, in particular, thin leadframe parts can be achieved as a result of the mechanically stabilizing effect of the potting body.

In accordance with at least one embodiment of the semiconductor component, the potting body, as seen in plan view, surrounds the semiconductor chip completely and all around. In this case, an area enclosed by the potting body, likewise as seen in plan view, is completely filled by the leadframe part on which the semiconductor chip is applied. By virtue of the fact that only one of the leadframe parts forms a surface within the potting body, a reflection behavior within this area is particularly uniform.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 1 to 8 show schematic illustrations of embodiments of optoelectronic semiconductor components described here.

DETAILED DESCRIPTION

The following detailed description refers to the accompanying drawing that show, by way of illustration, specific details and embodiments in which the disclosure may be practiced.

Figure 1:
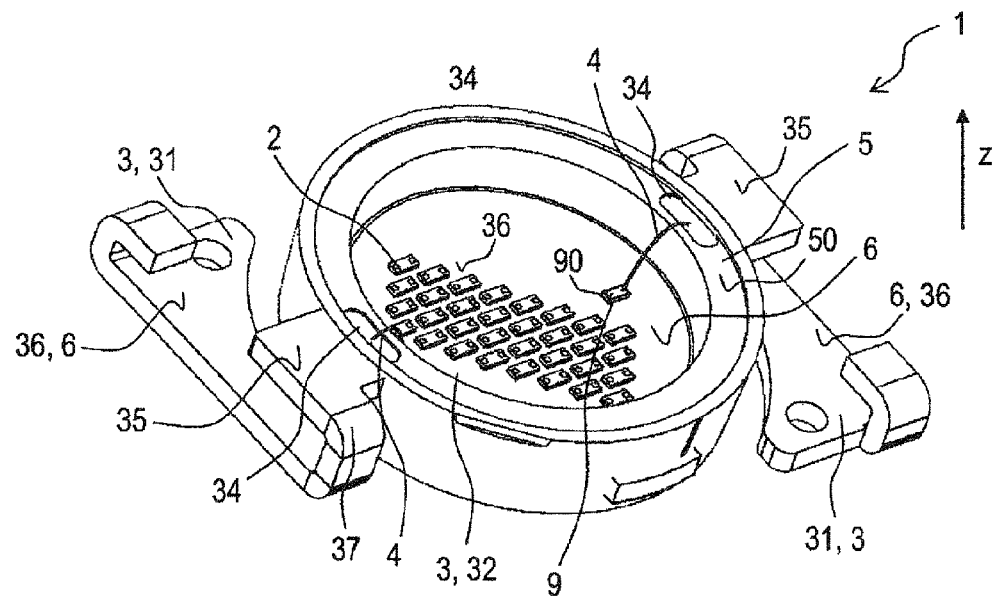

FIG. 1 illustrates an embodiment of an optoelectronic semiconductor component 1 in a perspective illustration. The semiconductor component 1 includes a leadframe 3 having three leadframe parts 31, 32. A multiplicity of optoelectronic semiconductor chips 2 are fitted in a matrix-like manner on the centrally arranged leadframe part 32. The semiconductor chips 2 are preferably light-emitting diodes, LEDs for short. The semiconductor component 1 is surface-mountable, being a so-called SMT component.

The leadframe parts 31, 32 each have a reflective coating 6 at a top side 36. The semiconductor chips 2 are applied, for example adhesively bonded, directly on the reflective coating 6 and thus on the top side 36 of the central leadframe part 32. The two outer leadframe parts 31 each have a bend 37 by 180°, such that in places an underside 35 of said leadframe parts 31, said underside 35 being situated opposite the top side 36, faces upward in the same direction as the top side 36 of the central leadframe part 32.

For electrical contact-connection, the semiconductor component 1 includes preferably two contact pedestals 9 having pedestal top sides 90 at the top side 36 of the central leadframe part 32. On account of the perspective illustration here only one of the contact pedestals 9, also designated as island die, can be discerned in FIG. 1. The contact pedestals 9 are of approximately the same size as the semiconductor chips 2, for example with a tolerance of at most 20% along all spatial directions. The semiconductor chips 2 are connected to the contact pedestals 9 and also among one another by means of comparatively thin bonding wires, which are not depicted in FIG. 1 and which are produced from gold, for example, and can have diameters of between 15 µm and 30 µm inclusive, in particular approximately 22 µm.

Furthermore, the contact pedestals 9 are electrically connected to contact locations 34 via connection means 4. The connection means 4 are shaped as bonding wires. A material of the connection means 4 is, for example, aluminum and/or gold and a thickness of the connection means 4 is, for example, approximately 50 µm or 75 µm. The contact locations 34 are formed by the parts of the undersides 35 of the outer leadframe parts 31 which face in a main emission direction z of the semiconductor chips 2. In this case, the contact locations 34 are completely surrounded all around in a lateral direction by a material of a potting body 5 and thereby shaded from the semiconductor chips 2. The individual leadframe parts 31, 32 of the leadframe 3 are mechanically connected to one another via the potting body 5.

Figure 2:
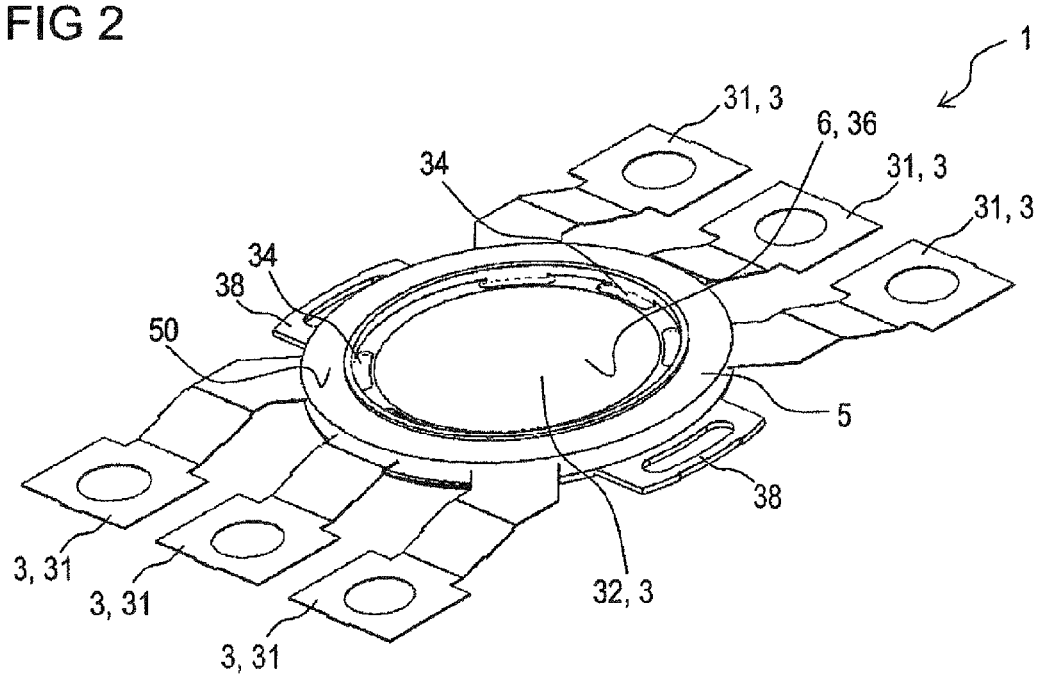
Figure 3:
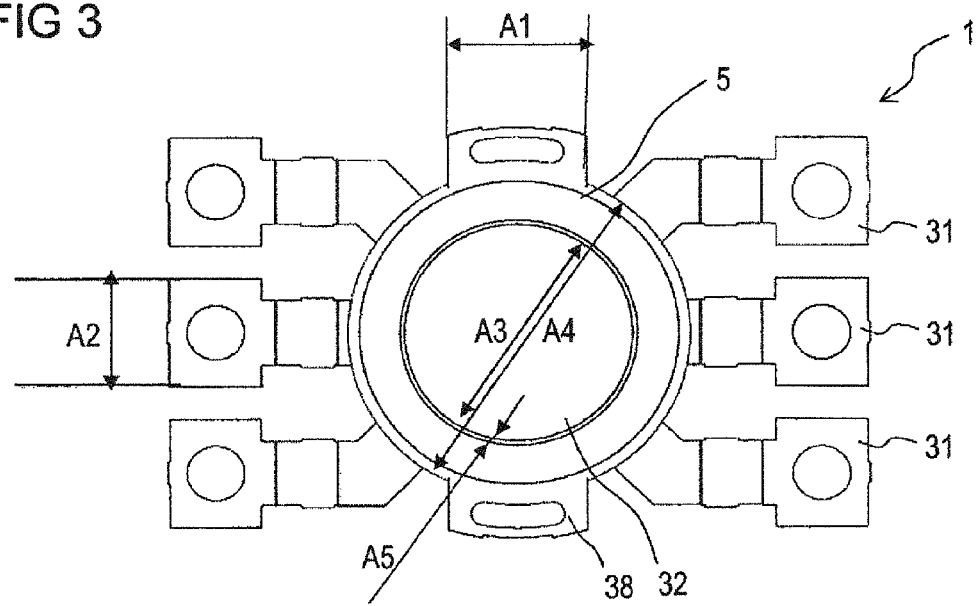
Figure 4:
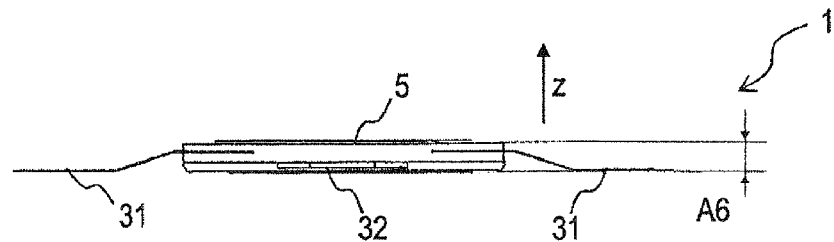

FIG. 2 illustrates a further embodiment of the semiconductor component 1 in perspective view. For simplification, the semiconductor chips 2 and also the connection means 4 and the optional contact pedestals 9 are not depicted. The semiconductor component 1 in accordance with FIG. 2 is also illustrated in a view from below in FIG. 3 and in a side view in FIG. 4.

The semiconductor component 1 a central leadframe part 32, which at two sides adjoins in each case three leadframe parts 31. The outer leadframe parts 31 and also the central leadframe part 32 are produced from mutually different stamping carriers. Only the central leadframe part 32 is provided with the reflective coating 6 at the top side 36. Optionally, the central leadframe part 32 is equipped with a fixing device 38.

A width A1 of the fixing device 38 is 12 mm. A width A2 of the leadframe parts 31 is 12 mm. An internal diameter A3 of the potting body 5 is 23 mm, and an external diameter A4 is 30 mm. A width A5 of a ledge to which the contact locations 34 are fitted, cf. FIG. 2, is 1.5 mm. A thickness A6 of the entire semiconductor component 1 is 2.7 mm. The stated dimensions or some of the stated dimensions may also apply to all of the other embodiments. The stated dimensions apply, in particular, in each case with a tolerance of at most 75% or of at most 50% or of at most 25%.

Figure 5:
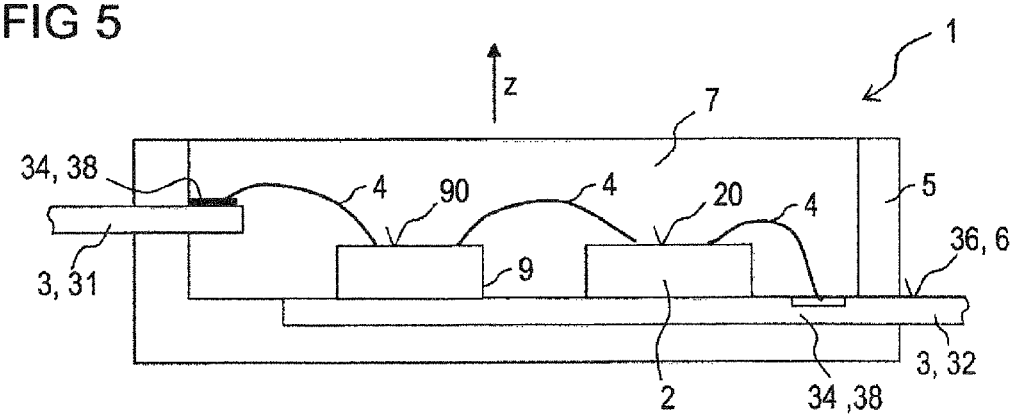

FIG. 5 illustrates a further embodiment of the semiconductor component 1 in a schematic sectional illustration. The leadframe parts 31, 32 do not lie in one plane. At the leadframe part 32 on which the semiconductor chip 2 having the radiation main side 20 is applied, a cutout is shaped in the coating 6 at the top side 36. The contact location 34 is realized thereby. The leadframe part 31 is preferably not provided with a reflective coating. Optionally, a respective contact coating 8 is applied to the contact locations 34 in order to simplify a connection of the connection means 4 to the leadframe parts 31, 32.

In contrast to the embodiment in accordance with FIG. 5, a component underside of the semiconductor component 1 is formed both by the potting body 5 and by the underside 35 of the leadframe part 32. Both contact locations 34 are formed by regions of the top sides 36 at which the reflective coating 6 is removed. In accordance with FIG. 6, the semiconductor chip 2 is directly connected to the leadframe part 31 via the connection means 4.

As also in all of the other embodiments, a cutout 7 formed through the potting body 5 can be provided with a filling into which the connection means 4 and the semiconductor chip 2 are embedded. The filling, not depicted in the figures, can be admixed with optical diffusion media or wavelength conversion media. By way of example, the filling includes a silicone or an epoxy or an epoxy-silicone hybrid material.

In accordance with FIG. 7, the semiconductor component 1 includes only a single leadframe part 32, on which a contact coating including a dielectric layer 8a and including an electrically conductive layer 8b is applied in places. The contact coating 8a, 8b forms the contact location 34. The contact location 34 can be shaped similarly to a conductor track.

In the embodiment in accordance with FIG. 8, both leadframe parts 31, 32 are provided with the contact coating 8, optionally with contact pedestals 9. The contact coating 8 is in each case applied to the reflective coating 6, such that the reflective coating 6 extends completely over the two top sides 36. A thickness of the contact coatings 8 is preferably in each case at most 25% of a thickness of the semiconductor chip 2 and/or at most 10 µm.

FIGS. 9A to 9G show a perspective illustration of a method for producing the optoelectronic semiconductor component 1, in particular as illustrated in FIG. 1. In a first step, see FIG. 9A, a stamping carrier 33 for the leadframe 3 is provided. The stamping carrier 33 is in the form of a metal sheet and has the top side 36 provided with the reflective coating 6 and the uncoated underside 35.

Figure 9A:
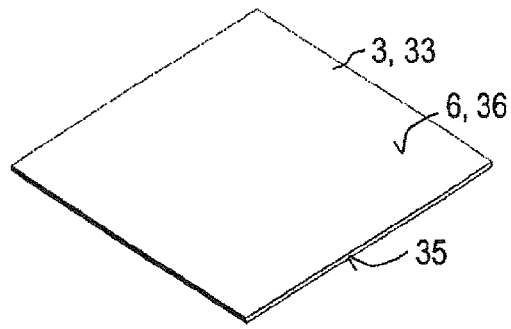
FIGS. 9A to 9G, 10A to 10D and 11A to 11D show schematic sequences of methods for producing semiconductor components described here.
Figure 9B:
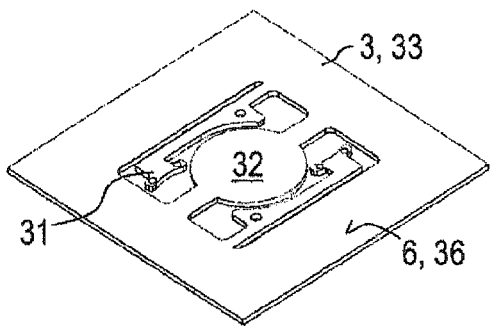
Figure 9C:
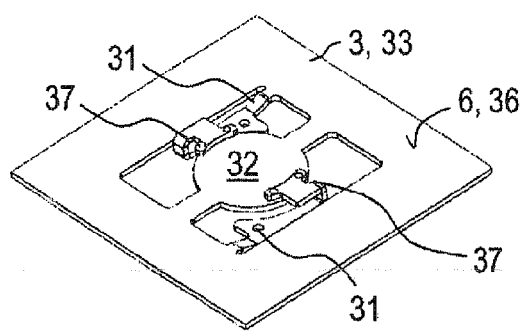
Figure 9D:
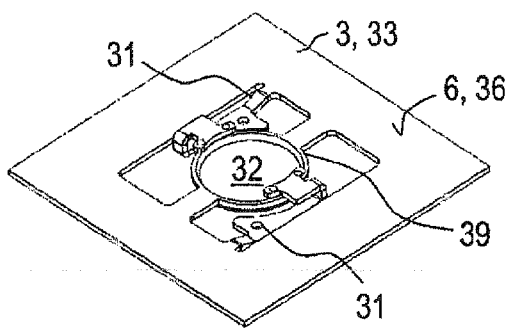

In a further method step, see FIG. 9B, the contours of the leadframe parts 31, 32 are shaped for instance by stamping. In a subsequent method step, see FIG. 9C, the bends 37 are shaped at the outer leadframe parts 31. Furthermore, in a further method step, see FIG. 9D, an embossing 39 is produced. The embossing 39 is effected in a ring-shaped manner, for example, and can be restricted to the central leadframe part 32.

Figure 9E:
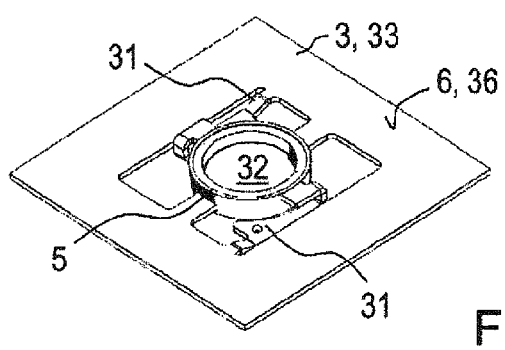
Figure 9F:
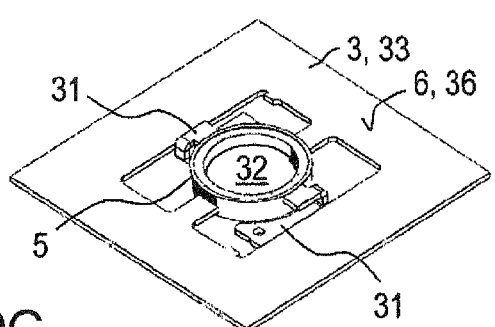

In a further method step, see FIG. 9E, the potting body 5 is produced for instance by means of injection molding or die-casting. The leadframe parts 31, 32 are thereby mechanically interconnected. In accordance with FIG. 9F, a connection of the outer leadframe parts 31 to the stamping carrier 33 is interrupted, such that only the leadframe part 32 is mechanically connected to the stamping carrier 33.

Figure 9G:
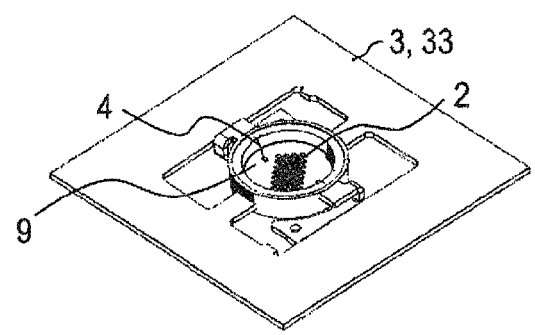

In a further method step, see FIG. 9G, the semiconductor chips 2 are fitted and electrical contact is made via the connection means 4 and the contact pedestals 9. Afterward, the remaining stamping carrier 33 is removed and the semiconductor component is singulated, with the result that the semiconductor component 1 in accordance with FIG. 1 is obtained, not illustrated in FIGS. 9A to 9G.

A method for producing a semiconductor component 1 in particular in accordance with FIG. 2 is shown schematically in perspective illustrations in FIGS. 10A to 10D. In accordance with FIG. 10A, a first stamping carrier 33a is provided. The stamping carrier 33a has the reflective coating 6 at the top side 36; a base material is aluminum, for example. Furthermore, a second stamping carrier 33b is provided, in which the contours of the outer leadframe parts 31 are shaped, see FIG. 10B. The second stamping carrier 33b is free of the reflective coating; a base material can be copper.

Figure 10A:
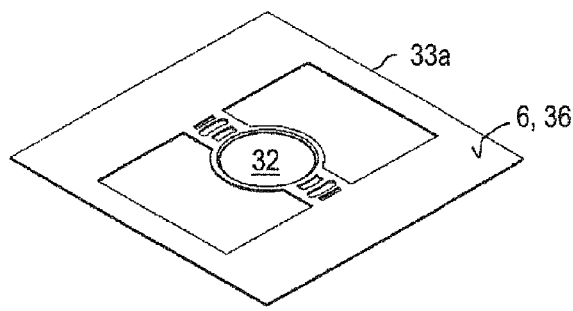
Figure 10B:
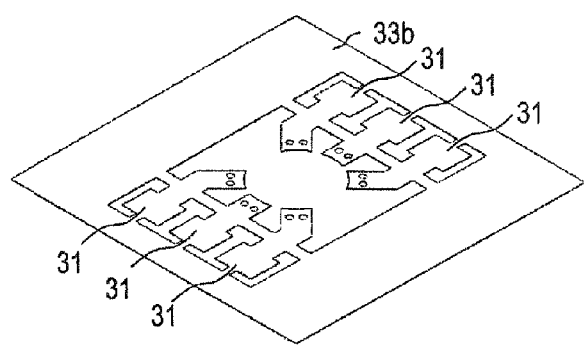
Figure 10C:
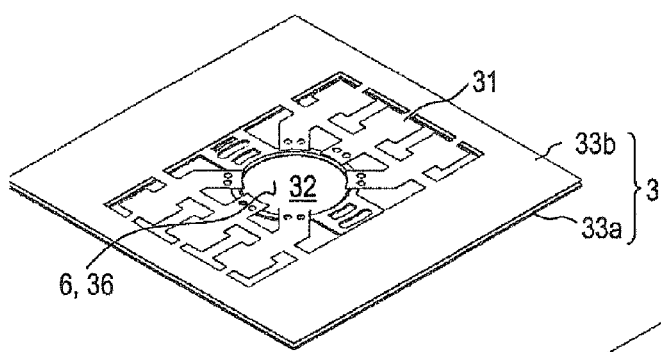
Figure 10D:
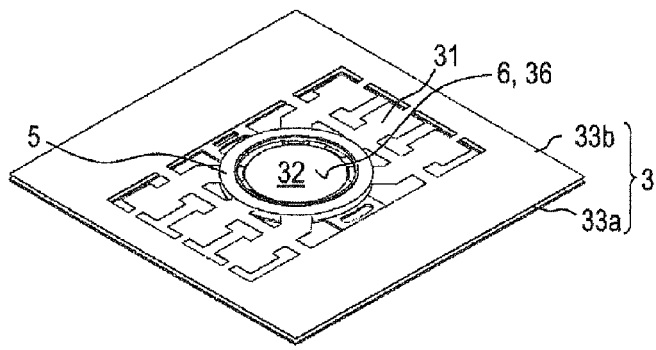

In a subsequent method step, see FIG. 10C, the stamping carriers 33a, 33b are joined together to form the leadframe 3, for instance by being placed one on top of the other or by being pressed together. As a result of the potting body 5 being created, the stamping carriers 33a, 33b and the leadframe parts 31, 32 are connected to one another, see FIG. 10D.

A further embodiment of a method for producing a semiconductor component 1 is illustrated in FIGS. 11A to 11D. In accordance with FIG. 11A, the leadframe parts 32 on which the semiconductor chips 2 are fixed are produced from a first stamping carrier 33, in particular including an aluminum alloy and having the reflective coating 6. The leadframe parts 31 for external electrical contact-connection of the semiconductor component 1 are shaped separately from the leadframe parts 32, from a further stamping carrier (not depicted in FIG. 11B), for example including a copper alloy. As also in all of the other exemplary embodiments, the leadframe parts 31 can be thinner than the leadframe parts 32.

Figure 11A:
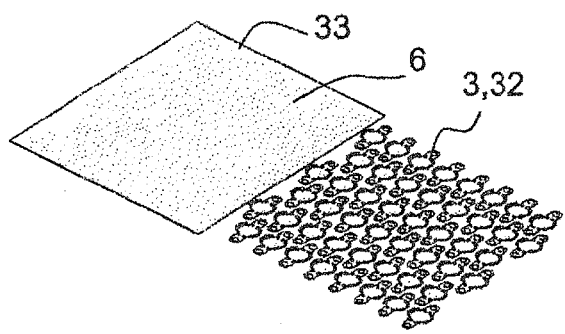
Figure 11B:
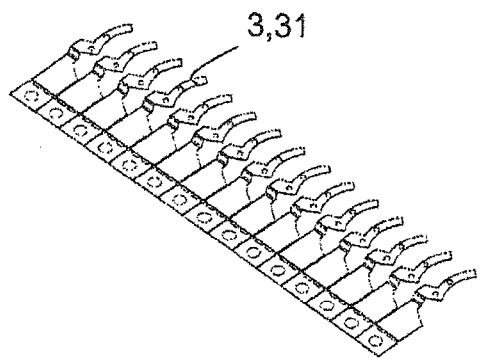
Figure 11C:
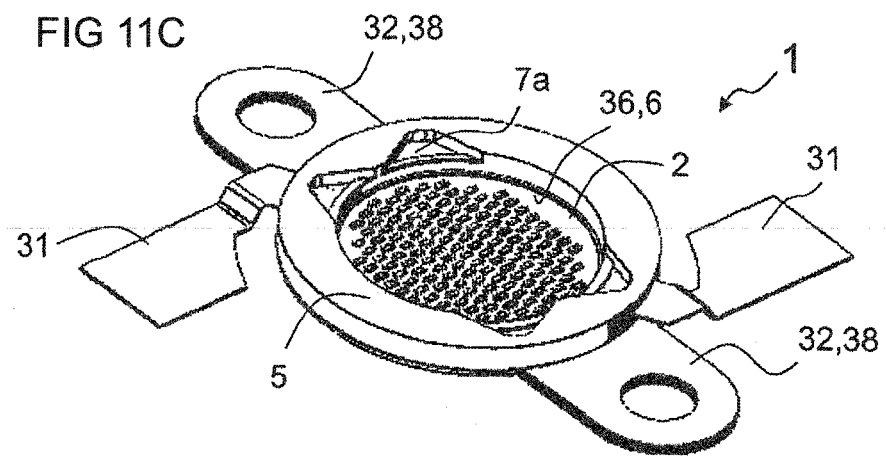

The leadframe parts 31, 32 prefabricated separately from one another are then introduced into an injection mold or compression mold (not illustrated) during the shaping of the potting body 5 and are mechanically connected to one another via the potting body 5, see the perspective illustration in FIG. 11C. The cutouts 7a are optionally shaped at the potting top side 50, such that the leadframe parts 31 are exposed.

Figure 11D:
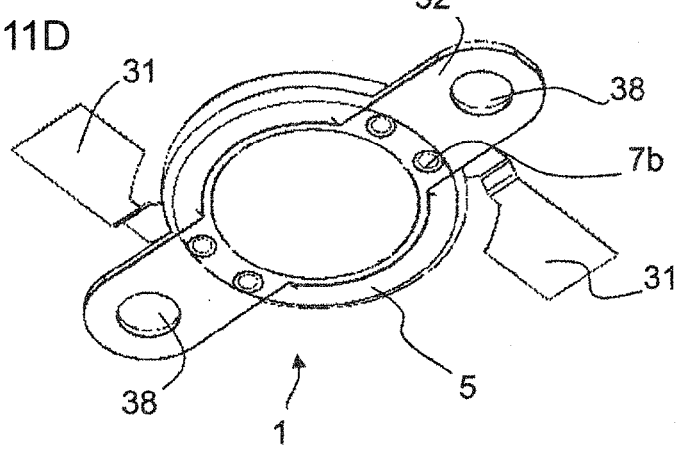

Furthermore, a perspective bottom view of the semiconductor component 1 is illustrated in FIG. 11D. Optionally, the leadframe part 32 has cutouts 7b which extend from the underside 35 as far as the leadframe parts 31 and are preferably situated opposite the cutouts 7a. The leadframe parts 31 can thereby be fixed better during the shaping of the potting body 5, together with the cutouts 7a at the potting top side 50.

The method steps of embossing the leadframe parts 31, 32 and optionally bending and fitting and wiring the semiconductor chips 2 are not illustrated separately in FIGS. 10A to 10D and 11A to 11D, but can likewise be carried out. In the method in accordance with FIGS. 10A to 10D or 11A to 11D, the processing of the two stamping carriers 33a, 33b can be effected analogously to the method in accordance with FIGS. 9A to 9G. The method steps are preferably carried out in the order indicated, but an order that deviates therefrom is also possible.

The methods as illustrated in FIGS. 9A to 9G, 10A to 10D and 11A to 11D can analogously be used for producing semiconductor components according to FIGS. 5 to 8. In particular, the methods may in each case include optional steps of applying contact coatings 8 and/or in places removing the reflective coating 6 in order to form the contact locations 34. Likewise, the methods may include further steps for casting/molding the filling (not depicted) and testing the semiconductor chips 2.

By means of the methods illustrated, a semiconductor component described can be produced in a small number of steps. Features for the semiconductor components are also disclosed for the methods, and vice versa.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic semiconductor component comprising:
   at least one optoelectronic semiconductor chip,
   a leadframe having one or a plurality of leadframe parts,
   at least two electrical connection means via which the semiconductor chip is electrically contact-connected to the leadframe, and
   a potting body, which is fitted to the leadframe and mechanically supports the leadframe,
   wherein
   the one or at least one of the leadframe parts is provided with a reflective coating at a top side,
   the semiconductor chip is fitted on the reflective coating at the top side,
   the leadframe comprises at least two contact locations, onto which the connection means are directly fitted,
   the contact locations are formed from a material that is different from the reflective coating, and
   wherein there is no straight, uninterrupted connecting line from a radiation main side of the semiconductor chip, said radiation main side facing away from the top side, to the contact locations such that the contact locations are shaded from direct radiation of the semiconductor chip.

2. The optoelectronic semiconductor component as claimed in claim 1,
   wherein the at least three leadframe parts are produced from the same stamping carrier and the reflective coating is applied continuously at the top sides in the leadframe parts, wherein undersides of the leadframe parts, said undersides being situated opposite the top sides, are free of the reflective coating.

3. The optoelectronic semiconductor component as claimed in claim 2,
   wherein two of the leadframe parts have a bend by 180°, such that a portion of the undersides of said leadframe parts faces in the same direction as the top side of the third leadframe part, on which the semiconductor chip is fitted.

4. The optoelectronic semiconductor component as claimed in claim 1,
   wherein the at least two leadframe parts are produced from mutually different stamping carriers,
   wherein only the top side of the leadframe part on which the semiconductor chip is fitted is provided with the reflective coating.

5. The optoelectronic semiconductor component as claimed in claim 1,
   wherein the reflective coating is removed from the top side of at least one of the leadframe parts at at least one of the contact locations,
   wherein the reflective coating covers at least 90% of said top side.

6. The optoelectronic semiconductor component as claimed in claim 1,
   wherein a contact coating is applied to the reflective coating in the case of at least one of the contact locations at the top side of at least one of the leadframe parts,
   wherein at least one of the connection means is fitted on the contact coating.

7. The optoelectronic semiconductor component as claimed in claim 1,
   wherein the top side of the leadframe part with the semiconductor chip is shaped in a planar fashion in a region not covered by the potting body, wherein as seen along a main emission direction of the semiconductor chips, the contact locations of the further leadframe parts are situated higher.

8. The optoelectronic semiconductor component as claimed in claim 1,
   wherein at least one contact pedestal is fitted on the top side of the leadframe part with the semiconductor chip,
   wherein at least two of the connection means are fitted to a pedestal top side facing away from the leadframe part.

9. The optoelectronic semiconductor component as claimed in claim 8,
   wherein a first of the connection means is led from one of the contact locations to the pedestal top side and a second of the connection means is led from the pedestal top side to the semiconductor chip,
   wherein the first and second connection means are shaped differently from one another and/or comprise different materials.

10. The optoelectronic semiconductor component as claimed in claim 1,
    wherein the contact locations are shaded by the potting body,
    wherein the potting body is formed from a light-opaque material.

11. The optoelectronic semiconductor component as claimed in claim 1,
    wherein at least one of the leadframe parts comprises an aluminum alloy as base material, and the reflective coating comprises or consists of silver and/or a silicon oxide and/or a titanium oxide, wherein the contact locations comprise or are based on or consist of aluminum, silver, nickel, NiP, palladium and/or gold.

12. The optoelectronic semiconductor component as claimed in claim 1,
wherein a thickness of the leadframe part on which the semiconductor chip is fitted, together with the reflective coating, is between 0.3 mm and 2.0 mm inclusive,
wherein an average diameter of said leadframe part is between 8 mm and 30 mm inclusive.

13. The optoelectronic semiconductor component as claimed in claim 1,
wherein a thickness of the leadframe part or of the leadframe parts which are designed for external electrical contact-connection of the semiconductor component is between 80 µm and 200 µm inclusive,
wherein this at least one leadframe part is produced from a copper alloy.

14. The optoelectronic semiconductor component as claimed in claim 1,
wherein as seen in plan view, the potting body completely surrounds the semiconductor chip all around, and an area enclosed by the potting body is completely filled by the leadframe part on which the semiconductor chip is applied.

* * * * *